April 3, 1973 M. ILEGEMS 3,725,149

LIQUID PHASE DIFFUSION TECHNIQUE

Filed Oct. 28, 1970

INVENTORS M. ILEGEMS
M. B. PANISH
BY Michael J. Urbano
ATTORNEY

United States Patent Office 3,725,149
Patented Apr. 3, 1973

3,725,149

LIQUID PHASE DIFFUSION TECHNIQUE

Marc Ilegems, Madison, and Morton B. Panish, Springfield, N.J., assignors to Bell Telephone Laboratories, Incorporated, Murray Hill and Berkeley Heights, N.J.

Filed Oct. 28, 1970, Ser. No. 84,790
Int. Cl. H01l 7/34, 7/38
U.S. Cl. 148—186 12 Claims

ABSTRACT OF THE DISCLOSURE

Impurities are diffused into a substrate by placing the impurities into a solution saturated with respect to the substrate material at the diffusion temperature. The solvent is subsequently brought into intimate contact with the substrate, a constant temperature being maintained during diffusion. Among others, the diffusion of Group II impurities into Group III–V compounds is described in detail.

BACKGROUND OF THE INVENTION

This invention relates to the diffusion of impurities from a solution into a substrate in intimate contact therewith and, more particularly, to the diffusion of Group II impurities into substrates of Group III–V compounds.

In the prior art, vacuum deposition techniques are generally utilized for the diffusion of Group II impurities (e.g., Be, Mg) into Group III–V substrates. That is, the impurity is evaporated onto the substrate, thereby forming a thin layer of the diffusant upon the exposed substrate surface. Subsequently, the substrate is heated to cause the diffusant to diffuse therein. From the standpoint of flexibility this technique is disadvantageous because of the inability to control independently the surface concentration of the diffusant which evaporates onto the substrate. In addition, in this technique the substrate is prone to surface damage from the partial dissolution of the substrate material into the evaporated diffusant layer which is the result of the diffusant and substrate not being in chemical equilibrium with one another.

Furthermore, the use of conventional vapor phase diffusion techniques, in which the substrate and impurity are heated in an evacuated quartz ampoule, are generally unsatisfactory for the diffusion of highly reactive impurities such as Li, Be, Mg and Ca, i.e., the vapors of such impurities react with the walls of the quartz ($SiO_2$) ampoule to produce oxides and contaminants (e.g., free Si), thereby causing the diffusion results to tend to be nonreproducible and further causing the introduction of such contaminants into the substrate.

In addition, both the vacuum deposition and vapor phase diffusion techniques necessitate the use of vacuum stations, and where the impurity such as Be or Mg is difficult to diffuse for reasons such as high reactivity towards oxidation, low vapor pressure or toxicity of the diffusant species, the criticality of maintaining high vacuum conditions is made even more severe.

It is therefore one object of our invention to reproducibly and controllably diffuse impurities from a solution into a substrate.

It is another object of our invention to perform such diffusion with reduced damage to the surface of the substrate being diffused.

It is yet another object of our invention to alleviate the difficulties inherent in diffusing impurities which have a relatively high reactivity toward oxidation, low vapor pressure or are toxic to humans.

SUMMARY OF THE INVENTION

These and other objects are accomplished in accordance with an illustrative method of our invention which utilizes a tipping apparatus comprising a furnace, a quartz tube positioned within the furnace, a graphite boat disposed within the tube and having a well for carrying a seed or substrate to be diffused, and a slidable solution holder disposed within the boat. The method illustratively comprises the steps of: placing into the well of the solution holder a predetermined amount of an impurity (e.g., Be), a solvent (e.g., liquid Ga) and a sufficient amount of the substrate material (e.g., GaP) so that at the diffusion temperature the solution is saturated with respect to the substrate material; heating the solution to saturation (e.g., with respect to P); lowering the temperature to a predetermined diffusion temperature; tipping the apparatus to cause the solution holder to slide and thereby bring the solution and substrate into intimate contact with one another; and maintaining the diffusion temperature substantially constant until a desired diffusion profile is achieved in the substrate.

In accordance with our technique the diffusion profile is readily controllable and reproducible by appropriate choice of several parameters including diffusion time, diffusion temperature and diffusant concentration in the solution. With respect to each of these parameters, an increase in time, temperature or concentration produces a corresponding increase in the depth of diffusion into the substrate.

We have discovered in addition that damage to the surface of the substrate is considerably reduced due to the fact that during diffusion the solution is saturated with respect to the substrate compound, i.e., the substrate material in solution and the substrate itself are in chemical equilibrium. Consequently, very little of the substrate at the diffusion interface has a tendency to dissolve into the solution. Furthermore, the addition of aluminum to the solution greatly reduces the solubility of Group V elements in the solution which reduces even further the possibility of surface damage to the substrate.

Our experiments have also shown that the instant technique is particularly advantageous, but not limited to, the diffusion of such materials as Be and Mg which either have a high reactivity toward oxidation, low vapor pressure or are toxic to humans. In this regard, the attractiveness of our method arises primarily from the diffusant species being in solution and not in a gaseous state. In addition, therefore, vacuum stations to eliminate oxygen from the ambient, or to isolate the gaseous impurity from human inhalation, are not required.

BRIEF DESCRIPTION OF THE DRAWING

These an other objects of the invention, together with its various features and advantages, can be more easy understood from the following more detailed description taken in conjunction with the accompanying drawing in which.

DETAILED DESCRIPTION

Figure 1:
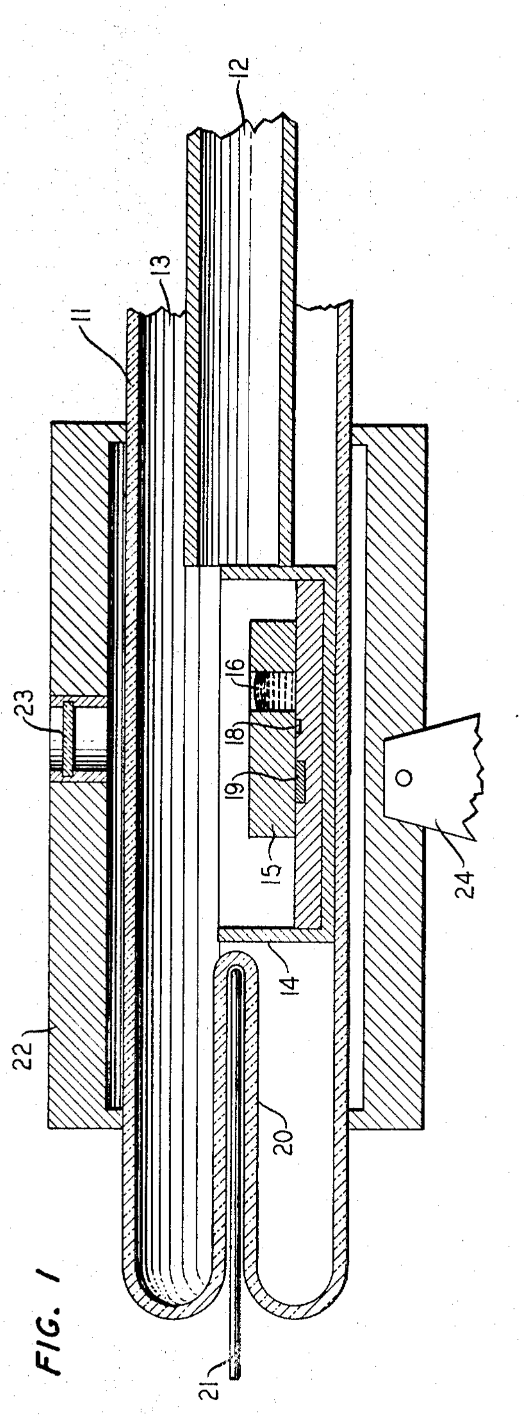
FIG. 1 is a cross-sectional view of an illustrative tipping apparatus used in accordance with one embodiment of our invention.

With further reference now to FIG. 1, there is shown a typical tipping apparatus utilized in the practice of our invention comprising a tube 11, typically comprised of fused silica, having an inlet 12 and an outlet 13 for the introduction and removal of gases, respectively, and a boat assembly 14 including a recess for rigidly carrying a seed or substrate 19. Disposed in the boat is a movable solution holder 15 having a well 16 for containing a source solution. Optionally, holder 15 may be adapted with groove means 18 for removing oxides and associated solid contaminants from the bottom surface of the source solution contained in well 16. The apparatus also contains a thermocouple well 20 and thermocouple 21 therein for determining the temperature of the system. Tube 11 is shown inserted in furnace 22 adapted with a viewing port 23, furnace 22 being positioned upon cradle 24 which permits tipping of the tube 11.

In accordance with our technique, a predetermined amount of an impurity and a solvent, i.e., a prescribed mixture, are placed in well 16 of solution holder 15 which is then inserted into tube 11. The mixture (e.g., GaP and liquid Ga) is characterized by the property that at the diffusion temperature it is in a liquid state saturated with respect to the material of the substrate 19 (e.g., GaP).

Figure 2:
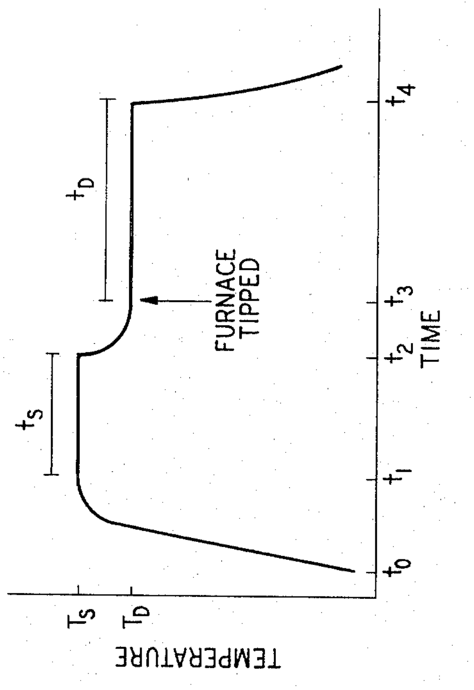
FIG. 2 is a graph showing an illustrative temperature cycle utilized in accordance with one embodiment of our invention.

Subsequently, the tube 11 is inserted into furnace 22, purged, and the system temperature is increased to a saturation temperature $T_s$ (see FIG. 2) which should be greater than, or equal to, the diffusion temperature $T_D$, but which is otherwise not critical. Of course, the higher is $T_s$, the faster the impurity dissolves into the solvent. Similarly, the saturation time $t_s$ during which the system temperature is maintained at $T_s$ is not critical.

During the time interval $(t_3-t_2)$ the system temperature is lowered to a predetermined diffusion temperature $T_D$ selected to produce a desired diffusion profile. At time $t_3$, the apparatus is tipped on cradle 24 causing solution holder 15 to slide to the left, thereby bringing seed 19 and the solution into intimate contact with one another. The sliding motion of the holder 15 across groove 18 advantageously removes oxides or other contaminants, if any, from the bottom of the solution. With the apparatus so tipped, the system temperature is maintained substantially constant at $T_D$ for a diffusion time $t_D=t_4-t_3$. At time $t_4$, the apparatus is tipped back, and the tube 11 is removed from the furnace to permit cooling.

As mentioned previously, the depth of the diffusion in the seed 19 may be increased by increasing $T_D$, $t_D$ or the concentration of the impurity in the solvent.

In addition, our invention may readily be practiced utilizing other apparatuses, e.g., the tipping apparatus of copending U.S. application Ser. No. 29,540, filed on Apr. 17, 1970, now U.S. Pat. 3,677,228 or the modified tipping and/or sliding apparatuses of copending U.S. application Ser. No. 28,365, now abandoned, filed on Apr. 14, 1970, both of which are assigned to the assignee hereof. Alternatively, a simple dipping technique in which the substrate is submerged in the solvent, may also be employed.

EXAMPLE I

This example describes the fabrication of a p–n junction device formed by diffusion of beryllium into n-type gallium phosphide in accordance with our invention. The substrate member consisted of an approximately 12 mils thick n-type gallium phosphide wafer having faces perpendicular to the <111> direction cut from a gallium phosphide ingot grown by the liquid encapsulated Czochralski technique. On one side of the wafer an approximately 1 mil thick, n-type, Te-doped gallium phosphide layer with a carrier concentration of about $5\times10^{17}/cm.^3$ had been grown epitaxially from a gallium solution in the conventional manner. The substrate was degreased, rinsed in deionized water, and etched for ten seconds in a chlorine-methanol solution prior to use. The substrate member was then inserted into the substrate holder of the apparatus with the solution grown side facing upwards. Following, a gallium-beryllium-phosphorus solution was prepared by placing 5.5 milligrams of beryllium (99.96% purity) obtained from commercial sources, 15.5 milligrams of undoped gallium phosphide, and 2.9 grams of liquid gallium metal (99.9999% purity) in the well of the apparatus shown in FIG. 1. The system was then sealed and nitrogen admitted thereto for the purpose of flushing out entrapped gases. Next, hydrogen was passed through the system and the apparatus was inserted into the furnace which was already heated to approximately 900° C. After holding the system at that temperature for approximately 30 minutes for the purpose of dissolving the beryllium and the gallium phosphide in the gallium, the furnace was cooled to 750° C. Note that it is permissible that the solution be undersaturated with respect to GaP at $T_S=900°$ C., provided that it is saturated at $T_D=750°$ C. When the temperature had stabilized (after a few minutes) at 750° C., the furnace was tipped, thereby causing the gallium-beryllium-phosphorus liquid to come into intimate contact with the GaP substrate member. At this point the beryllium starts to diffuse from the gallium-beryllium-phosphorus liquid into the substrate. After 60 minutes, the furnace was tipped back to horizontal. Subsequently, the apparatus was removed from the furnace and cooled to room temperature. To determine the depth to which the beryllium had diffused in the substrate member the resulting structure was cleaved. Etching of the exposed <110> cleavage planes for one minute in a room temperature solution of 8 g. $K_3Fe(CN)_6$:12 g. KOH:100 ml. $H_2O$ revealed a diffused junction depth of approximately nine micrometers.

In order to demonstrate p-n junction behavior in the resulting structure, several mesa diodes were made in the conventional manner by protecting certain areas of the diffused surface while the rest of the diffused layer was etched away until the underlying n-side became exposed. Individual mesa diodes were cut from the substrate and ohmic contacts were made to the mesas by alloying a gold-zinc wire to the p-side and a gold-tin wire to the n-side of the crystal in a stream of hydrogen. The resultant structures were finally mounted on a transistor type header in the manner described in U.S. Pat. 3,470,038 of R. A. Logan et al.

In order to demonstrate the efficacy of the resultant devices, the leads were connected to a D-C source under forward bias conditions, the plus lead to the p-region and the minus lead to the n-region. At room temperature, at a forward voltage of +2.2 volts, the device was found to carry about 20 milliamperes of current accompanied by the emission of orange light. The emission spectrum was concentrated in a band centered at about 1.85 electron volts (6700 A.) encompasing the range from 1.7 to 2 electron volts and showing in addition considerable near bandgap emission (i.e., emission in the green) centered at about 2.2 ev. (5630 A.). The measured external quantum efficiencies as determined by means of a calibrated solar cell were found to be in the range from approximately $5\times10^{-3}$ to $1\times10^{-2}$ percent. The reverse breakdown voltage of the diodes was in the range 8–10 volts.

While the invention has been described in detail in the foregoing specification and the drawings similarly illustrate the same, the aforesaid is by way of illustration only and is not restrictive in character. The modifications which will readily suggest themselves to persons skilled in the art are all considered within the scope of this invention, reference being had to the appended claims.

Specifically, in the case of beryllium diffusion in gallium phosphide, p-n junction formation has been observed following diffusions at temperatures in the range 600° C.–1000° C. and for diffusion times in the range 5 minutes to 64 hours. Similarly, the temperature at which the melt is saturated prior to diffusion has been varied in a range extending from a temperature equal to the diffusion temperature upwards to 1025° C. Finally, apart from the substrate member described above (a Czochralski grown substrate with an epitaxial layer) diffusions have been carried out in GaP substrates which were (1) solution grown, (2) vapor grown, and (3) liquid encapsulated Czochralski grown (without an epitaxial layer).

EXAMPLE II

Utilizing the same apparatus and procedure described in Example I, Be has been diffused into vapor grown n-type layers of GaN deposited on (0114) or (0001)

oriented sapphire wafer. The solutions, ranging from 1.1 to 7.5 mg. of Be placed in about 3.0 g. of Ga, were heated to saturation temperatures ranging from 400° C. to 800° C. for times ranging between 30 minutes and 2 hours. Diffusions were carried out at temperatures ranging from 200° C. to 800° C. for times ranging between 30 minutes and 1 hour. Evidence that Be diffused into the GaN layers was obtained by measurements showing that the sheet resistivity of the layers increased after diffusion.

EXAMPLE III

Again utilizing the same apparatus and procedure described in Example I, Mg has been diffused into an n-type GaP substrate obtained from an ingot grown by the liquid encapsulated Czochralski technique. A solution of about 14.4 mg. of Mg, 18.7 mg. of undoped GaP and 1.5 g. of Ga was heated to a saturation temperature of about 900° C. for 120 minutes. Diffusion also took place at 900° C. for 120 minutes. Evidence that Mg diffused into the GaP substrate was obtained from low temperature photoluminescence spectra which exhibited an emission line at 2.160 ev. which is characteristic of Mg.

EXAMPLES IV–VI

Utilizing a tipping apparatus having a sliding ram, as described in the aforementioned copending patent application Ser. No. 29,540, but otherwise following the procedure of Example I, Be, Mg and Mn have been diffused into a lapped and polished, (100) oriented, n-type, Se-doped GaAs substrate obtained from commercial sources.

TABLE

| Melt | $T_D$, ° C. | $t_D$ Minutes | $t_D$ Hours | $T_S$, ° C. | $t_S$, minutes |
|---|---|---|---|---|---|
| Example IV: | | | | | |
| 0.1-5 mg. Be | 1,000 | 5 | 12 | 1,000 | 10 |
| 100 mg. GaAs | 1,000 | 5 | 12 | 1,000 | 10 |
| 22 mg. Al | 1,000 | 5 | 12 | 1,000 | 10 |
| 1 mg. Ga | 1,000 | 5 | 12 | 1,000 | 10 |
| Example V: | | | | | |
| 5 mg. Mg | 1,000 | 20 | --------- | 1,000 | 10 |
| 100 mg. GaAs | 1,000 | 20 | --------- | 1,000 | 10 |
| 22 mg. Al | 1,000 | 20 | --------- | 1,000 | 10 |
| 1 g. Ga | 1,000 | 20 | --------- | 1,000 | 10 |
| Example VI: | | | | | |
| 10 mg. Mn | 1,000 | 20 | --------- | 1,000 | 10 |
| 100 mg. GaAs | 1,000 | 20 | --------- | 1,000 | 10 |
| 22 mg. Al | 1,000 | 20 | --------- | 1,000 | 10 |
| 1 g. Ga | 1,000 | 20 | --------- | 1,000 | 10 |

In a similar manner, Ca is diffused into GaAs or other substrates. Each of the diffused substrates, when cleaved and etched, exhibited p-n junctions. As previously mentioned, the addition of Al to the melt in the above Examples IV–VI serves to lower the solubility of As in Ga and thereby reduce the possibility of surface damage.

Following the same procedure, Group I impurities such as Li, Na, K (which also have a high reactivity towards oxidation as do Be, Mg and Ca) can be diffused into not only III–V substrates, but also II–VI substrates such as ZnS, ZnSe, ZnTe, CdS, CdSe and CdTe. In the case of a ZnS substrate, for example, a melt of Zn saturated with S (and including Li as a dopant, for example) is utilized to produce a solution in chemical equilibrium with the substrate. Similarly, in the case of a GaAs substrate, a melt of Ga saturated with As (and including K as a dopant, for example) is utilized.

In all of the foregoing, it should be noted that the primary solvent element (e.g., Ga for diffusion in GaAs or Zn for diffusion into ZnS) need not be one of elements comprising the substrate. Thus, for diffusion into II–VI compounds, the solvent need not be a Group II element, but may instead be a heavy, low melting point, metal such as Bi, Pb or Sn in which the II–VI substrate is only sparingly soluble.

In this fashion, liquid phase diffusion is effected in such substrates as Ge or Si. In the case of a Ge substrate, for example, a Sn solution saturated with Ge (and including the desired dopant, e.g., Be) may be utilized. Little diffusion of Sn will take place compared to that of Be ($z=4$) since Sn ($z=50$) is a much larger atom and hence has a much lower diffusion rate.

What is claimed is:

1. A method of diffusing an impurity into a substrate of a Group III–V compound comprising the steps of (a) providing a mixture, including a predetermined amount of the impurity and said III–V compound, which is characterized by the property that a preselected diffusion temperature it is a liquid saturated with respect to the Group III–V material of the substrate, said mixture further including a predetermined amount of aluminum effective to reduce the solubility of the Group V element of the substrate in the solution to be formed from the mixture, (b) heating the mixture to a saturation temperature at least as high as the diffusion temperature, thereby to form a liquid solution from the mixture, (c) after a predetermined saturation time effective to dissolve the constituents of the mixture into solution, adjusting the temperature of the solution and substrate to the preselected diffusion temperature, (d) bringing the solution and the substrate into intimate contact with one another, and (e) maintaining the diffusion temperature substantially constant until a desired diffusion profile is produced in the substrate.

2. The method of claim 1 including between steps (c) and (d) the additional step of removing contaminants, if any, from the surface of the solution to be brought into contact with the substrate.

3. The method of claim 1 wherein the mixture is placed in the well of a solution holder and the substrate is placed in the recess of a substrate holder, both of the holders being disposed in slidable contact with one another and within a diffusion tube located in a furnace, the solution and substrate being brought into contact with one another by sliding at least one of the holders with respect to the other.

4. The mehod of claim 3 wherein the substrate holder includes groove means on the surface thereof in sliding contact with the solution holder effective to remove contaminants from the solution prior to contact with the substrate.

5. The method of claim 1 wherein the impurity comprises a Group I element.

6. The method of claim 5 wherein the impurity is an element selected from the group consisting of Li, Na and K.

7. The method of claim 6 wherein the substrate is a compound selected from the group consisting of GaP, GaAs and GaN.

8. The method of claim 1 wherein the impurity comprises a Group II element.

9. The method of claim 8 wherein the impurity is an element selected from the group consisting of Be, Mg and Ca.

10. The method of claim 9 wherein the substrate is a compound selected from the group consisting of GaP, GaAs and GaN.

11. The method of claim 1 wherein the impurity is characterized by a high reactivity towards oxidation.

12. The method of claim 11 wherein the impurity consists of an element selected from the group consisting of Li, Na, K, Be, Mg and Ca.

(References on following page)

References Cited

UNITED STATES PATENTS

| | | | |
|---|---|---|---|
| 2,762,730 | 9/1956 | Alexander | 148—186 |
| 2,835,613 | 5/1958 | Haayman | 148—186 |
| 3,551,219 | 12/1970 | Panish et al. | 148—172 |
| 3,560,276 | 2/1971 | Panish et al. | 148—171 |
| 3,565,702 | 2/1971 | Nelson | 148—172 |
| 3,245,847 | 4/1966 | Pizzarello | 148—177 |
| 3,549,434 | 12/1970 | Aven | 148—188 X |

OTHER REFERENCES

Kressel et al.: "Ionization Energy of Mg and Be . . . in GaAs," J. Applied Physics, vol. 41, March 1970, p. 1865.

Poltoratskii et al.: "Coherent Radiation . . . Diffusion of Beryllium," Soviet Physics—Solid State, vol. 7, No. 7, January 1966, p. 1798–1799, "Diffusion of Beryllium in GaAs."

Soviet Physics—Solid State State, vol. 8, No. 3, September 1966, p. 770.

L. DEWAYNE RUTLEDGE, Primary Examiner

W. G. SABA, Assistant Examiner

U.S. Cl. X.R.

148—171, 172, 188